US005858626A

United States Patent [19]
Sheriff et al.

[11] Patent Number: 5,858,626
[45] Date of Patent: Jan. 12, 1999

[54] METHOD OF FORMING A POSITIVE IMAGE THROUGH INFRARED EXPOSURE UTILIZING DIAZONAPHTHOQUINONE IMAGING COMPOSITION

[75] Inventors: Eugene Lynn Sheriff, Johnstown; Ralph Scott Schneebeli, Ft. Collins, both of Colo.

[73] Assignee: Kodak Polychrome Graphics, Norwalk, Conn.

[21] Appl. No.: 907,607

[22] Filed: Aug. 8, 1997

Related U.S. Application Data

[63] Continuation-in-part of Ser. No. 723,335, Sep. 30, 1996, Pat. No. 5,705,308.

[51] Int. Cl.$^6$ .................................................... G03F 7/30
[52] U.S. Cl. ................................ 430/326; 430/944
[58] Field of Search ........................... 430/165, 190, 430/191, 192, 193, 278.1, 944, 325, 326, 328

[56] References Cited

U.S. PATENT DOCUMENTS

| 3,046,120 | 7/1962 | Schmidt et al. . | |
|---|---|---|---|
| 3,837,860 | 9/1974 | Roos . | |
| 3,902,906 | 9/1975 | Iwama et al. . | |
| 4,306,010 | 12/1981 | Uehara et al. | 430/190 |
| 4,306,011 | 12/1981 | Uehara et al. | 430/190 |
| 4,308,368 | 12/1981 | Kubo et al. | 525/504 |
| 4,356,254 | 10/1982 | Takahashi et al. | 430/296 |
| 4,529,682 | 7/1985 | Toukhy | 430/190 |
| 4,544,627 | 10/1985 | Takahashi et al. | 430/325 |
| 4,576,901 | 3/1986 | Stahlhofen et al. | 430/325 |
| 4,609,615 | 9/1986 | Yamashita et al. | 430/325 |
| 4,927,741 | 5/1990 | Garth et al. | 430/309 |
| 5,145,763 | 9/1992 | Bassett et al. | 430/169 |
| 5,149,613 | 9/1992 | Stahlhofen et al. | 430/296 |
| 5,200,292 | 4/1993 | Shinozaki et al. | 430/191 |
| 5,279,918 | 1/1994 | Nishi et al. | 430/190 |
| 5,340,699 | 8/1994 | Haley et al. | 430/302 |
| 5,368,977 | 11/1994 | Yoda et al. | 430/190 |
| 5,372,907 | 12/1994 | Haley et al. | 430/157 |
| 5,380,622 | 1/1995 | Roser | 430/325 |
| 5,437,952 | 8/1995 | Hirai et al. | 430/83 |
| 5,466,557 | 11/1995 | Haley et al. | 430/278 |
| 5,491,046 | 2/1996 | DeBoer et al. | 430/302 |
| 5,631,119 | 5/1997 | Shinozaki | 430/326 |
| 5,705,308 | 1/1998 | West et al. | 430/165 |
| 5,705,322 | 1/1998 | West et al. | 430/325 |

FOREIGN PATENT DOCUMENTS

| 672954 | 9/1995 | European Pat. Off. . |
| 4426820 | 2/1995 | Germany . |
| 1546633 | 5/1979 | United Kingdom . |
| 2082339 | 3/1982 | United Kingdom . |
| 93/06528 | 4/1993 | WIPO . |
| 96/20429 | 7/1996 | WIPO . |

*Primary Examiner*—Christopher G. Young
*Attorney, Agent, or Firm*—Ratner & Prestia

[57] ABSTRACT

An infrared imaging composition contains two essential components, namely an infrared absorbing compound, and a phenolic resin that is either mixed or reacted with an o-diazonaphthoquinone derivative. These compositions are useful in positive-working elements such as lithographic printing plates that can be adapted to direct-to-plate imaging procedures. The weight ratio of infrared radiation absorbing compound to diazonaphthoquinone moiety is less than 1:14.

20 Claims, No Drawings

METHOD OF FORMING A POSITIVE IMAGE THROUGH INFRARED EXPOSURE UTILIZING DIAZONAPHTHOQUINONE IMAGING COMPOSITION

CROSS-REFERENCE TO RELATED APPLICATIONS

This application is a continuation-in-part of Ser. No. 08/723,335, filed Sep. 30, 1996, now U.S. Pat. No. 5,705, 308.

FIELD OF THE INVENTION

This invention relates to a photosensitive composition and positive-working element that are sensitive to infrared radiation. In particular, this invention relates to positive-working lithographic printing plates.

BACKGROUND OF THE INVENTION

The art of lithographic printing is based up on the immiscibility of oil and water, wherein the oily material or ink is preferentially retained by the image area and the water or fountain solution is preferentially retained by the non-image area. When a suitably prepared surface is moistened with water and an ink is then applied, the background or non-image areas retain the water and repel the ink while the image areas accept the ink and repel the water. The ink on the image areas is then transferred to the surface of a material upon which the image is to be reproduced, such as paper, cloth and other materials. Commonly, the ink is transferred to an intermediate material called the blanket which in turn transfers the ink to the surface of the material upon which the image is to be reproduced.

A widely used type of lithographic printing plate has a light-sensitive coating applied to an aluminum base support. The coating may respond to light by having the portion that is exposed become soluble so that it is removed in the developing process. Such a plate is referred to in the art as a positive-working printing plate. Conversely, when that portion of the coating that is exposed becomes hardened, the plate is referred to as a negative-working plate. In both instances, the image areas remaining are ink-receptive or oleophilic and the non-image areas or background are water-receptive or hydrophilic. The differentiation between image and non-image areas is made in the exposure process where a film is applied to the plate with a vacuum to insure good contact. The plate is then exposed to a light source, a portion of which is composed of UV radiation. In the instance of negative-working plates, the areas on the film corresponding to the image areas are clear, allowing light to harden the image area coating, while the areas on the film corresponding to the non-image areas are black, preventing the light hardening process, so the areas not struck by light can be removed during development. The light-hardened surfaces of a negative-working plate are therefore oleophilic and will accept ink while the non-image areas that have had the coating removed through the action of a developer are desensitized and are therefore hydrophilic.

Various useful printing plates that can be either negative-working or positive-working are described, for example, in GB 2,082,339 (Horsell Graphic Industries), and U.S. Pat. No. 4,927,741 (Garth et al), both of which describe imaging layers containing an o-diazonaphthoquinone and a resole resin, and optionally a novolac resin. Another plate that can be similarly used is described in U.S. Pat. No. 4,708,925 (Newman) wherein the imaging layer comprises a phenolic resin and a radiation-sensitive onium salt. This imaging composition can also be used for the preparation of a direct laser addressable printing plate, that is imaging without the use of a photographic transparency.

Direct digital imaging of offset printing plates is a technology that has assumed importance to the printing industry. The first commercially successful workings of such technology made use of visible light-emitting lasers, specifically argon-ion and frequency doubled Nd:YAG lasers. Printing plates with high photosensitivities are required to achieve acceptable through-put levels using plate-setters equipped with practical visible-light laser sources. Inferior shelf-life, loss in resolution and the inconvenience of handling materials under dim lighting are trade-offs that generally accompany imaging systems exhibiting sufficiently high photosensitivities.

Advances in solid-state laser technology have made high-powered diode lasers attractive light sources for plate-setters. Currently, at least two printing plate technologies have been introduced that can be imaged with laser diodes emitting in the infrared regions, specifically at about 830 nm. One of these is described in EP 573,091 (Agfa) and in several patents and published applications assigned to Presstek, Inc [for example, U.S. Pat. No. 5,353,705 (Lewis et al), U.S. Pat. No. 5,351,617 (Williams et al), U.S. Pat. No. 5,379,698 (Nowak et al), U.S. Pat. No. 5,385,092 (Lewis et al) and U.S. Pat. No. 5,339,737 (Lewis et al)]. This technology relies upon ablation to physically remove the imaging layer from the printing plate. Ablation requires high laser fluences, resulting in lower through-puts and problems with debris after imaging.

A higher speed and cleaner technology is described, for example, in U.S. Pat. No. 5,340,699 (Haley et al), U.S. Pat. No. 5,372,907 (Haley et al), U.S. Pat. No. 5,466,557 (Haley et al) and EP-A-0 672 954 (Eastman Kodak) which uses near-infrared energy to produce acids in an imagewise fashion. These acids catalyze crosslinking of the coating in a post-exposure heating step. Precise temperature control is required in the heating step. The imaging layers in the plates of U.S. Pat. No. 5,372,907 (noted above) comprise a resole resin, a novolac resin, a latent Bronsted acid and an infrared absorbing compound. Other additives, such as various photosensitizers, may also be included.

DE-4,426,820 (Fuji) describes printing plates that can be imaged in the near infrared at moderate power levels with relatively simple processing requirements. In one embodiment, the printing plate has at least two layers: an imaging layer containing an o-diazonaphthoquinone compound and an infrared absorbing compound, and a protective overcoat containing a water-soluble polymer or silicone polymer. Other plates have a single layer. In all cases, the plates are floodwise exposed with ultraviolet light to convert the o-diazonaphthoquinone to an indenecarboxylic acid, which is then imagewise decarboxylated by means of heat transferred from the infrared absorbing material. Development with an alkaline solution results in removal of areas not subjected to thermal decarboxylation. The pre-imaging floodwise exposure step, however, is awkward in that it precludes the direct loading of the printing plates into plate-setters.

Thus, there is a need for positive-working printing plates that can be easily imaged in the near infrared at moderate power levels and that can be directly processed after imaging.

SUMMARY OF THE INVENTION

The problems noted above with known photosensitive compositions and printing plates are overcome with a positive-working imaging composition consisting essentially of:

a) (i) a mixture of a phenolic resin and an o-diazonaphthoquinone derivative,
(ii) a reaction product of a phenolic resin and an o-diazonaphthoquinone reactive derivative, or
(iii) a mixture of (i) and (ii) and b) a compound that absorbs infrared radiation at a maximum absorption wavelength greater than 750 nm, wherein the weight ratio of b) to the diazonaphthoquinone of a) is less than 1:14.

This invention also provides an element consisting essentially of a support having thereon a positive-working imaging layer consisting essentially of the imaging composition described above.

This invention also provides a method of creating a positive image consisting essentially of the steps of:

A) providing an element as described above,

B) without prior or simultaneous floodwise exposure, imagewise exposing the element with an infrared radiation emitting laser, and C) contacting the element with an aqueous developing solution to remove the image areas.

The imaging composition and element of this invention are useful for providing high quality positive images using moderately powered lasers. This makes the element much more convenient to use in plate-setters. The element of this invention also does not need a protective overcoat thereby eliminating the materials and coating step required for such layers. Moreover, such elements are imagewise exposed without any prior or simultaneous floodwise exposure to UV or other actinic radiation.

Since the elements of this invention are infrared sensitive, digital imaging information can be conveniently utilized to form continuous or halftone images using the moderately powered laser diodes.

DETAILED DESCRIPTION OF THE INVENTION

As noted above, the positive-working imaging composition of this invention contains only two essential components a) and b):

a) either
(i) a mixture of a phenolic resin and an o-diazonaphthoquinone derivative,
(ii) a reaction product of a phenolic resin and an o-diazonaphthoquinone reactive derivative, or
(iii) a mixture of (i) and (ii), and b) a compound that absorbs infrared radiation at a maximum absorption wavelength greater than 750 nm.

The resins useful in the practice of this invention to form a reaction product with an o-diazonaphthoquinone reactive derivative can be any type of resin that has a suitable reactive group for participating in such a reaction. For example, such resins can have a reactive hydroxy group. The phenolic resins defined below are most preferred, but other resins include copolymers of acrylates and methacrylates with hydroxy-containing acrylates or methacrylates, as described for example in U.S. Pat. No. 3,859,099 (Petropoulos et al), for example, a copolymer of hydroxyethyl methacrylate and methyl methacrylate.

The phenolic resins useful herein are light-stable, water-insoluble, alkali-soluble film-forming resins that have a multiplicity of hydroxy groups either on the backbone of the resin or on pendant groups. The resins typically have a molecular weight of at least 350, and preferably of at least 1000, as determined by gel permeation chromatography. An upper limit of the molecular weight would be readily apparent to one skilled in the art, but practically it is about 100,000. The resins also generally have a pKa of not more than 11 and as low as 7.

As used herein, the term "phenolic resin" includes, but is not limited to, what are known as novolac resins, resole resins and polyvinyl compounds having phenolic hydroxy groups. Novolac resins are preferred.

Novolac resins are generally polymers that are produced by the condensation reaction of phenols and an aldehyde, such as formaldehyde, or aldehyde-releasing compound capable of undergoing phenol-aldehyde condensation, in the presence of an acid catalyst. Typical novolac resins include, but are not limited to, phenol-formaldehyde resin, cresol-formaldehyde resin, phenol-cresol-formaldehyde resin, p-t-butylphenol-formaldehyde resin, and pyrogallol-acetone resins. Such compounds are well known and described for example in U.S. Pat. No. 4,308,368 (Kubo et al), U.S. Pat. No. 4,845,008 (Nishioka et al), U.S. Pat. No. 5,437,952 (Hirai et al) and U.S. Pat. No. 5,491,046 (DeBoer et al), U.S. Pat. No. 5,143,816 (Mizutani et al) and GB 1,546,633 (Eastman Kodak). A particularly useful novolac resin is prepared by reacting m-cresol or phenol with formaldehyde using conventional conditions.

Another useful phenolic resin is what is known as a "resole resin" that is a condensation product of bis-phenol A and formaldehyde. One such resin is commercially available as UCAR phenolic resin BKS-5928 from Georgia Pacific Corporation.

Still another useful phenolic resin is a polyvinyl compound having phenolic hydroxyl groups. Such compounds include, but are not limited to, polyhydroxystyrenes and copolymers containing recurring units of a hydroxystyrene, and polymers and copolymers containing recurring units of halogenated hydroxystyrenes. Such polymers are described for example in U.S. Pat. No. 4,845,008 (noted above). Other hydroxy-containing polyvinyl compounds are described in U.S. Pat. No. 4,306,010 (Uehara et al) and U.S. Pat. No. 4,306,011 (Uehara et al) which are prepared by reacting a polyhydric alcohol and an aldehyde or ketone, several of which are described in the patents. Still other useful phenolic resins are described in U.S. Pat. No. 5,368,977 (Yoda et al).

A mixture of the resins described above can be used, but preferably, a single novolac resin is present in the imaging composition of this invention.

When the composition of this invention is formulated as a coating composition in suitable coating solvents, the resin is present in an amount of at least 0.5 weight percent. Preferably, it is present in an amount of from about 1 to about 10 weight percent.

In the dried imaging layer of the element of this invention, the resin is the predominant material. Generally, it comprises at least 25 weight percent of the layer, and more preferably, it is from about 60 to about 90 weight percent of the dried layer.

In one embodiment of this invention, a phenolic resin is present in admixture with an o-diazonaphthoquinone derivative. Such compounds comprise an o-diazonaphthoquinone moiety or group attached to a ballasting moiety that has a molecular weight of at least 15, but less than 5000.

The o-diazonaphthoquinone derivatives have at least one o-diazonaphthoquinone moiety or group in the molecule, and which is made more soluble in an alkali solution upon irradiation with actinic light. Such derivatives are prepared from compounds that are well known in the art, including those described, for example in Kosar, *Light-Sensitive System,* John Wiley & Sons Inc., 1965, such as esters or amides with a suitable aromatic polyhydroxy compound or amine. Examples are esters of 2-diazo-1,2-dihydro-1-oxonaphthalenesulfonic acid or carboxylic acid chlorides.

Useful derivatives include, but are not limited to:

2,4-bis(2-diazo-1,2-dihydro-1-oxo-5-naphthalenesulfonyloxy)benzophenone, 2-diazo-1,2-dihydro-1-oxo-5-naphthalenesulfonyloxy-2,2-bis hydroxyphenylpropane monoester, the hexahydroxybenzophenone hexaester of 2-diazo-1,2-dihydro-1-oxo-5-naphthalenesulfonic acid, 2,2'-bis(2-diazo-1,2-dihydro-1-oxo-5-naphthalenesulfonyloxy)biphenyl, 2,2',4,4'-tetrakis(2-diazo-1,2-dihydro-1-oxo-5-naphthalenesulfonyloxy)biphenyl, 2,3,4-tris(2-diazo-1,2-dihydro-1-oxo-5-naphthalenesulfonyloxy)benzophenone, 2,4-bis(2-diazo-1,2-dihydro-1-oxo-4-naphthalenesulfonyloxy)benzophenone, 2-diazo-1,2-dihydro-1-oxo-4-naphthalenesulfonyloxy-2,2-bis hydroxyphenylpropane monoester, the hexahydroxybenzophenone hexaester of 2-diazo-1,2-dihydro-1-oxo-4-naphthalenesulfonic acid, 2,2'-bis(2-diazo-1,2-dihydro-1-oxo-4-naphthalenesulfonyloxy)biphenyl, 2,2',4,4'-tetrakis(2-diazo-1,2-dihydro-1-oxo-4-naphthalenesulfonyloxy)biphenyl, 2,3,4-tris(2-diazo-1,2-dihydro-1-oxo-4-naphthalenesulfonyloxy)benzophenone, and others known in the art, for example described in U.S. Pat. No. 5,143,816 (noted above).

The dry weight ratio of phenolic resin to o-diazonaphthoquinone derivative in this embodiment is generally at least 0.5:1, and a weight ratio of from about 2:1 to about 6:1 is preferred.

In another and preferred embodiment of this invention, a reaction product of a resin (as described above) and an o-diazonaphthoquinone reactive derivative is used in the imaging composition. Such a derivative has a functional group (such as chloride or reactive imide group) that can react with a suitable reactive group (for example, a hydroxy group) of the resin (such as a phenolic resin) and thereby become part of the resin, rendering the resin sensitive to actinic radiation. The reactive group can be in the 4- or 5-position of the o-diazonaphthoquinone molecule.

Representative reactive compounds include sulfonic and carboxylic acid, ester or amide derivatives of the o-diazonaphthoquinone moiety. Preferred compounds are the sulfonyl chloride or esters, and the sulfonyl chlorides are most preferred. Reactions with the phenolic resins are well known in the art, being described for example in GB 1,546,633 (noted above), U.S. Pat. No. 4,308,368 (noted above) and U.S. Pat. No. 5,145,763 (Bassett et al).

The amount of o-diazonaphthoquinone moiety in the dried imaging composition is generally at least 5 weight percent, and more preferably from about 15 to about 40 weight percent.

The second essential component of the imaging composition of this invention is an infrared radiation absorbing compound (or IR absorbing compound), or mixture thereof. Such compounds typically have a maximum absorption wavelength ($\lambda_{max}$) in the region of at least 750 nm, that is in the infrared region and near infrared of the spectrum, and more particularly, from about 800 to about 1100 nm. Thus, such compounds are not intended to include broad band absorbers that may minimally absorb in the near infrared or infrared regions but whose maximum absorption wavelengths are in the visible or UV regions (that is, below about 750 nm). The compounds can be dyes or pigments, and a wide range of compounds are well known in the art (including U.S. Pat. No. 4,912,083, U.S. Pat. No. 4,942,141, U.S. Pat. No. 4,948,776, U.S. Pat. No. 4,948,777, U.S. Pat. No. 4,948,778, U.S. Pat. No. 4,950,639, U.S. Pat. No. 4,950,640, U.S. Pat. No. 4,952,552, U.S. Pat. No. 4,973,572, U.S. Pat. No. 5,036,040 and U.S. Pat. No. 5,166,024). Classes of materials that are useful include, but are not limited to, squarylium, croconate, cyanine (including phthalocyanine), merocyanine, chalcogenopyryloarylidene, oxyindolizine, quinoid, indolizine, pyrylium and metal dithiolene dyes or pigments. Other useful classes include thiazine, azulenium and xanthene dyes. Particularly useful infrared absorbing dyes are of the cyanine class.

The amount of infrared absorbing compound in the dried imaging layer is generally sufficient to provide an optical density of at least 0.5 in the layer, and preferably, an optical density of from about 1 to about 3. This range would accommodate a wide variety of compounds having vastly different extinction coefficients. Generally, this is at least 1 weight percent, and preferably from about 5 to about 25 weight percent.

It is critical that the dry weight ratio of infrared radiation absorbing compound to diazonaphthoquinone moiety (whether in admixture or a reaction product) be less than 1:14, and preferably, it is from about 1:50 to about 1:330, for the composition of this invention to be positive-working.

Optional, non-essential components of the imaging composition include colorants, sensitizers, stabilizers, exposure indicators and surfactants in conventional amounts.

Another optional component of the imaging composition is one or more non-photosensitive "dissolution inhibitor compounds". Such compounds have polar functionality that serve as acceptor sites for hydrogen bonding with hydroxy groups on aromatic rings. The acceptor sites are atoms with high electron density, preferably selected from electronegative first row elements. Useful polar groups include keto groups and vinylogous esters. Other groups may also be useful, such as sulfones, sulfoxides, thiones, phosphine oxides, nitriles, imides, amides, thiols, ethers, alcohols, ureas as well as nitroso, azo, azoxy, nitro and halo groups. In general, it is desired that such compounds have an "inhibition factor" of at least 0.5, and preferably at least 5. Inhibition factors for given compounds can be readily measured using the procedure described by Shih et al, *Macromolecules,* Vol. 27, p. 3330 (1994). The inhibition factor is the slope of the line obtained by plotting the log of the development rate as a function of inhibitor concentration in the phenolic resin coating. Development rates are conveniently measured by laser interferometry, as described by Meyerhofer in *IEEE Trans. Electron Devices,* ED-27, 921 (1980).

Representative compounds having the desired properties include aromatic ketones including, but not limited to, xanthone, flavanone, flavone, 2,3-diphenyl-1-indenone, 1'-(2'-acetonaphthonyl)benzoate, α- and β-naphthoflavone, 2,6-diphenyl-4H-pyran-4-one and 2,6-diphenyl-4H-thiopyran-4-one. α-Naphthoflavone, 2,6-diphenyl-4H-pyran-4-one and 2,6-diphenyl-4H-thiopyran-4-one are preferred.

The dissolution inhibitors are not themselves actually sensitive to near-IR radiation. Their dissolution inhibition abilities are presumably altered by the localized heating that results from irradiation of the IR absorbing compound. Thus, by "non-photosensitive" is meant that these compounds are not significantly sensitive to actinic radiation having a wavelength above 400 nm, and preferably above 300 nm.

The amount of one or more such compounds in the imaging composition of this invention can vary widely, but generally it is at least about 1 weight percent, based on the total dry composition weight.

Obviously, the imaging composition is coated out of one or more suitable organic solvents that have no effect on the sensitivity of the composition. Various solvents for this purpose are well known, but acetone and 1-methoxy-2-propanol are preferred. The essential components of the composition are dissolved in the solvents in suitable proportions.

Suitable conditions for drying the composition involve heating for a period of time of from about 0.5 to about 5 minutes at a temperature in the range of from about 20° to about 150° C.

To form an element of this invention, the imaging composition is applied (usually by coating techniques) onto a suitable support, such as a metal, polymeric film, ceramics or polymeric-coated paper using conventional procedures and equipment. Suitable metals include aluminum, zinc or steel, but preferably, the metal is aluminum. A most preferred support is an electrochemically grained and sulfuric acid anodized aluminum sheet that has been further treated with an acrylamide-vinylphosphonic acid copolymer according to the teaching in U.S. Pat. No. 5,368,974. Such elements are generally known as lithographic printing plates, but other useful elements include printed circuit boards.

The thickness of the resulting imaging layer, after drying, on the support can vary widely, but typically it is in the range of from about 0.5 to about 2 $\mu$m, and preferably from about 1 to about 1.5 $\mu$m.

No other essential layers are provided on the element of this invention. In particular, there is no protective or other type of layer over the imaging layer which is the outermost layer. Optional, but not preferred subbing or antihalation layers can be disposed under the imaging layer, or on the backside of the support (such as when the support is a transparent polymeric film).

The elements of this invention are uniquely adapted for "direct-to-plate" imaging applications. Such systems utilize digitized image formation, as stored on a computer disk, compact disk, computer tape or other digital information storage media, or information that can be provided directly from a scanner, that is intended to be printed. The bits of information in a digitized record correspond to the image elements or pixels of the image to be printed. This pixel record is used to control the exposure device, that is a modulated laser beam. The position of the laser beam can be controlled using any suitable means known in the art, and turned on and off in correspondence with pixels to be printed. The exposing beam is focused onto the unexposed element of this invention. Thus, no exposed and processed films are needed for imaging of the elements, as in the conventional lithographic imaging processes.

Laser imaging can be carried out using any moderate or high-intensity laser diode writing device. Specifically, a laser printing apparatus is provided that includes a mechanism for scanning the write beam across the element to generate an image without ablation. The intensity of the write beam generated at the laser diode source at the element is at least 10 milliwatts/$\mu$m$^2$ (preferably from 10–1000 milliwatts/$\mu$m$^2$). During operation, the element to be exposed is placed in the retaining mechanism of the writing device and the write beam is scanned across the element to generate an image.

Following laser imaging, the printing plate of this invention is then developed in an alkaline developer solution until the image areas are removed to provide the desired positive image. Development can be carried out under conventional conditions for from about 30 to about 120 seconds. One useful aqueous alkaline developer solution is a silicate solution containing an alkali metal silicate or metasilicate. Such a developer solution can be obtained from Eastman Kodak Company as KODAK PRODUCTION SERIES Machine Developer/Positive.

After development, the element is usually treated with a finisher such as gum arabic. However, after imaging, the plate is subjected to no other essential steps, except development. Thus, no post-imaging bake step is carried out, nor is floodwise exposure needed before or after imaging. A post-development baking step can be used, if desired, to increase run length of the plate.

The following examples are provided to illustrate the practice of this invention, and not to limit it in any manner. Unless otherwise noted, all percentages are by weight.

EXAMPLE 1

A positive-working imaging coating formulation was prepared as follows:

| COMPONENT | GRAMS |
|---|---|
| Cresol-formaldehyde novolac resin | 42.273 |
| Diester of 2-diazo-1,2-dihydro-1-oxo-5-naphthalenesulfonate and 2,3,4-trihydroxybenzophenone | 7.128 |
| IR absorbing dye* | 0.599 |
| 1-Methoxy-2-propanol solvent | 950 |

*IR dye is 2-(2-(2-chloro-3-((1,3-dihydro-1,1,3-trimethyl-2H-benz(e)indol-2-ylidene)ethylidene)-1-cyclohexen-1-yl)ethenyl)-1,1,3-trimethyl-III-benz(e)indolium, salt with 4-methylbenzenesulfonic acid.

This formulation was applied to give a dry coating weight of about 120 g/m$^2$ onto electrochemically grained and sulfuric acid anodized aluminum sheets that had been further treated with an acrylamide-vinylphosphonic acid copolymer (according to U.S. Pat. No. 5,368,974, noted above) to form an unexposed lithographic printing plate.

The plate was imaged with a 500 milliwatt diode laser emitting a modulated pulse centered at 830 nm. The plate was then processed with KODAK PRODUCTION SERIES Machine Developer/Positive to provide a high resolution positive image.

EXAMPLE 2

A second imaging coating formulation of this invention was prepared using a cresol-formaldehyde novolac resin (purchased from Schenectady Chemical Company) derivatized (at 3%) with 2-diazo-1,2-dihydro-1-oxo-5-naphthalenesulfonyl chloride (45.259 grams of derivatized resin), the IR absorbing dye of Example 1 (0.626 grams), diester of 2-diazo-1,2-dihydro-1-oxo-5-naphthalenesulfonyloxy and 2,3,4-trihydroxybenzophenone (4.115 grams)and 1-methoxy-2-propanol solvent (950 grams).

This formulation was used to prepare a lithographic printing plate that was imaged and processed as described in Example 1 to provide a high resolution positive image.

EXAMPLE 3

Another imaging coating formulation of this invention was prepared using a cresol-formaldehyde novolac resin (purchased from Schenectady Chemical Company) derivatized (at 6%) with 2-diazo-1,2-dihydro-1-oxo-5-naphthalenesulfonyl chloride (49.374 grams of derivatized resin), the IR absorbing dye of Example 1 (0.626 grams), diester of 2-diazo-1,2-dihydro-1-oxo-5-naphthalenesulfonyloxy and 2,3,4-trihydroxybenzophenone (4.115 grams) and 1-methoxy-2-propanol solvent (950 grams).

This formulation was used to prepare a lithographic printing plate that was imaged and processed as described in Example 1 to provide a high resolution positive image.

EXAMPLE 4

A similar imaging coating formulation of this invention was prepared using a cresol-formaldehyde novolac resin (purchased from Schenectady Chemical Co.) derivatized (3%) with 2-diazo-1,2-dihydro-1-oxo-4-naphthalenesulfonyl chloride (45.3 grams of derivatized resin), the IR absorbing dye of Example 1 (0.626 grams), and 1-methoxy-2-propanol solvent (950 grams).

This formulation was used to prepare a lithographic printing plate that was imaged and processed as described in Example 1 to provide a high resolution positive image.

The invention has been described in detail with particular reference to preferred embodiments thereof, but it will be understood that variations and modifications can be effected within the spirit and scope of the invention.

We claim:

1. A method of providing forming a positive image, the method comprising the steps of:
    A) without a prior or a simultaneous floodwise exposure, imagewise exposing with infrared radiation an imaging layer of an imaging element, and forming image areas in said imaging layer; and
    B) contacting said element with an aqueous developing solution and removing said image areas of said imaging layer;
  wherein:
    said imaging element comprises a support having thereon said imaging layer;
    said imaging layer comprises:
      a) (i) a mixture of a phenolic resin and an o-diazonaphthoquinone derivative,
        (ii) a reaction product of a phenolic resin and an o-diazonaphthoquinone reactive derivative, or
        (iii) a mixture of (i) and (ii); and
      b) a compound that absorbs infrared radiation, said compound having a maximum absorption wavelength greater than 750 nm;
    the dry weight ratio of said infrared absorbing compound b) to the o-diazonaphthoquinone moiety in said mixture (i) and in said reaction product (ii) is less than 1:14; and
    said imaging layer is the outermost layer of said element.

2. The method of claim 1 in which there is no floodwise exposure between step A) and step B).

3. The method of claim 2 in which component a) is reaction product (ii).

4. The method of claim 3 in which the phenolic resin is a novolac resin.

5. The method of claim 2 in which the ratio is from about 1:50 to about 1:330.

6. The method of claim 2 in which the imaging layer additionally comprises a non-photosensitive dissolution inhibitor compound having an inhibition factor of at least 0.5.

7. The method of claim 2 in which said o-diazonaphthoquinone reactive derivative is a sulfonic acid or carboxylic acid ester of o-diazonaphthoquinone.

8. The method of claim 7 in which component a) is reaction product (ii) and in which the phenolic resin is a novolac resin.

9. The method of claim 2 in which said o-diazonaphthoquinone derivative is 2,4-bis(2-diazo-1,2-dihydro-1-oxo-5-naphthalenesulfonyloxy)benzophenone, 2-diazo-1,2-dihydro-1-oxo-5-naphthalenesulfonyloxy-2,2-bis(hydroxyphenyl)propane monoester, the hexahydroxybenzophenone hexaester of 2-diazo-1,2-dihydro-1-oxo-5-naphthalenesulfonic acid, 2,2'-bis(2-diazo-1,2-dihydro-1-oxo-5 -naphthalenesulfonyloxy)biphenyl, 2,2'4,4'-tetrakis (2-diazo-1,2-dihydro-1-oxo-5-naphthalenesulfonyloxy) biphenyl, 2,3,4-tris (2-diazo-1,2-dihydro-1-oxo-5-naphthalenesulfonyloxy)-benzophenone, 2,4-bis(2-diazo-1, 2-dihydro-1-oxo-4-naphthalene-sulfonyloxy) benzophenone, 2-diazo-1,2-dihydro-1-oxo-4-naphthalenesulfonyloxy-2,2-bishydroxyphenylpropane monoester, the hexahydroxybenzophenone hexaester of 2-diazo-1,2-dihydro-1-oxo-4-naphthalenesulfonic acid, 2,2'-bis(2-diazo-1,2-dihydro-1-oxo-4-naphthalenesulfonyloxy) biphenyl, 2,2',4,4'-tetrakis(2-diazo-1,2-dihydro-1-oxo-4-naphthalenesulfonyloxy)biphenyl, or 2,3,4-tris(2-diazo-1,2-dihydro-1-oxo-4-naphthalenesulfonyloxy)benzophenone.

10. The method of claim 2 in which said infrared radiation absorbing compound is (i) a squarylium, croconate, cyanine, merocyanine, indolizine, pyrylium or metal dithiolene dye or (ii) a pigment that absorbs infrared radiation at a wavelength of from about 800 to about 1100 nm.

11. The method of claim 10 in which component a) is reaction product (ii), the phenolic resin is a novolac resin, and the o-diazonaphthoquinone reactive derivative is a sulfonic acid or carboxylic acid ester of o-diazonaphthoquinone; in which the infrared radiation absorbing compound is present in an amount sufficient to provide an optical density of at least 0.5; and in which the ratio is from about 1:50 to about 1:330.

12. The method of claim 11 in which the imaging layer additionally comprises a non-photosensitive dissolution inhibitor compound having an inhibition factor of at least 0.5.

13. The method of claim 11 in which said infrared radiation absorbing compound is present in an amount sufficient to provide an optical density of from about 1 to about 3.

14. The method of claim 2 wherein said support is a polyester film or a sheet of grained and anodized aluminum.

15. A method of forming a positive image, the method comprising the steps of:
    A) without a prior or simultaneous floodwise exposure, imagewise exposing with infrared radiation an imaging layer of an imaging element, and forming image areas in said imaging layer; and
    B) contacting said element with an aqueous developing solution and removing said image areas of said imaging layer;
  wherein:
    said imaging element comprises of a support having thereon said imaging layer;
    said imaging layer consists essentially of:
      a) (i) a mixture of a phenolic resin and an o-diazonaphthoquinone derivative,
        (ii) a reaction product of a phenolic resin and an o-diazonaphthoquinone reactive derivative, or
        (iii) a mixture of (i) and (ii); and
      b) a compound that absorbs infrared radiation, said compound having a maximum absorption wavelength greater than 750 nm;

c) optionally, a non-photosensitive dissolution inhibitor compound having an inhibition factor of at least 0.5; and d) optionally, one or more components selected from the group consisting of colorants, sensitizers, stabilizers, exposure indicators, and surfactants;

said imaging layer is the outermost layer of said element;

the dry weight ratio of said infrared absorbing compound b) to the o-diazonaphthoquinone moiety in said mixture (i) and in said reaction product (ii) is less than 1:14; and there is no floodwise exposure between step A) and step B).

16. The method of claim 15 in which the ratio is from about 1:50 to about 1:330.

17. The method of claim 16 in which component a) is reaction product (ii), the phenolic resin is a novolac resin, and the o-diazonaphthoquinone reactive derivative is a sulfonic acid or carboxylic acid ester of o-diazonaphthoquinone; in which the infrared radiation absorbing compound is present in an amount sufficient to provide an optical density of at least 0.5; and in which the ratio is from about 1:50 to about 1:330.

18. The method of claim 15 in which said o-diazonaphthoquinone derivative is 2,4-bis(2-diazo-1,2-dihydro-1-oxo-5-naphthalenesulfonyloxy)benzophenone, 2-diazo-1,2-dihydro-1-oxo-5-naphthalenesulfonyloxy-2,2-bis(hydroxyphenyl)propane monoester, the hexahydroxybenzophenone hexaester of 2-diazo-1,2-dihydro-1-oxo-5-naphthalenesulfonic acid, 2,2'-bis(2-diazo-1,2-dihydro-1-oxo-5-naphthalenesulfonyloxy)biphenyl, 2,2',4,4'-tetrakis(2-diazo-1,2-dihydro-1-oxo-5-naphthalenesulfonyloxy)biphenyl, 2,3,4-tris (2-diazo-1,2-dihydro-1-oxo-5-naphthalenesulfonyloxy)-benzophenone, 2,4-bis(2-diazo-1,2-dihydro-1-oxo-4-naphthalene-sulfonyloxy)benzophenone, 2-diazo-1,2-dihydro-1-oxo-4-naphthalenesulfonyloxy-2,2-bishydroxyphenylpropane monoester, the hexahydroxybenzophenone hexaester of 2-diazo-1,2-dihydro-1-oxo-4-naphthalenesulfonic acid, 2,2'-bis(2-diazo-1,2-dihydro-1-oxo-4-naphthalenesulfonyloxy)biphenyl, 2,2',4,4'-tetrakis(2-diazo-1,2-dihydro-1-oxo-4-naphthalenesulfonyloxy)biphenyl, or 2,3,4-tris(2-diazo-1,2-dihydro-1-oxo-4-naphthalenesulfonyloxy)benzophenone.

19. The method of claim 15 in which said infrared radiation absorbing compound is (i) a squarylium, croconate, cyanine, merocyanine, indolizine, pyrylium or metal dithiolene dye or (ii) a pigment that absorbs infrared radiation at a wavelength of from about 800 to about 1100 nm.

20. The method of claim 19 in which component a) is reaction product (ii), the phenolic resin is a novolac resin, and the o-diazonaphthoquinone reactive derivative is a sulfonic acid or carboxylic acid ester of o-diazonaphthoquinone; in which the infrared radiation absorbing compound is present in an amount sufficient to provide an optical density of at least 0.5; and in which the ratio is from about 1:50 to about 1:330.

* * * * *